(12) United States Patent
Jheng et al.

(10) Patent No.: US 8,685,840 B2
(45) Date of Patent: Apr. 1, 2014

(54) IN-SITU GETTERING METHOD FOR REMOVING METAL IMPURITIES FROM THE SURFACE AND INTERIOR OF A UPGRADED METALLURGICAL GRADE SILICON WAFER

(75) Inventors: Jin-Jang Jheng, New Taipei (TW); Tsun-Neng Yang, Taipei (TW); Chin-Chen Chiang, Taoyuan County (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 154 days.

(21) Appl. No.: 13/313,124

(22) Filed: Dec. 7, 2011

(65) Prior Publication Data
US 2013/0149843 A1 Jun. 13, 2013

(51) Int. Cl.
*H01L 21/322* (2006.01)
(52) U.S. Cl.
USPC .......................................................... 438/477
(58) Field of Classification Search
CPC .............. H01L 21/322; H01L 21/3221; H01L 21/3223; H01L 21/3225; H01L 21/3226
USPC ........... 257/E21.318, E21.321, 913; 438/471, 438/477, FOR. 144
See application file for complete search history.

(56) References Cited

U.S. PATENT DOCUMENTS

| | | | | |
|---|---|---|---|---|
| 3,556,879 A * | 1/1971 | Mayer | ............................. | 438/477 |
| 4,231,809 A * | 11/1980 | Schmidt | ........................ | 438/477 |
| 4,561,171 A * | 12/1985 | Schlosser | ........................ | 438/58 |
| 6,197,694 B1 * | 3/2001 | Beinglass | ...................... | 438/694 |
| 7,081,303 B2 * | 7/2006 | Yasui et al. | ..................... | 428/446 |
| 7,755,113 B2 * | 7/2010 | Yamazaki et al. | ............. | 257/257 |
| 7,972,942 B1 * | 7/2011 | Yang | .............................. | 438/476 |
| 2002/0102857 A1 * | 8/2002 | Sato | ............................... | 438/714 |
| 2008/0202582 A1 * | 8/2008 | Noda | .............................. | 438/57 |
| 2008/0206952 A1 * | 8/2008 | Nagata et al. | .................. | 438/409 |
| 2009/0039319 A1 * | 2/2009 | Straboni | ........................ | 252/500 |
| 2009/0253252 A1 * | 10/2009 | Sanjurjo | ........................ | 438/508 |
| 2010/0279492 A1 * | 11/2010 | Yang | ............................. | 438/476 |
| 2010/0330786 A1 * | 12/2010 | Schwandner et al. | ......... | 438/493 |

OTHER PUBLICATIONS

'Microstructural control of porous silicon by electrochemical etching in mixed HCIrHF solutions', S. Zangooie, R. Jansson, H. Arwin, Department of Physics and Measurement Technology, Linkoping Unilersity, S-581 83 Linkoping, Sweden.*

* cited by examiner

*Primary Examiner* — Jarrett Stark
*Assistant Examiner* — Mohammad M Hoque
(74) *Attorney, Agent, or Firm* — Jackson IPG PLLC

(57) ABSTRACT

An in-situ gettering method for removing impurities from the surface and interior of a upgraded metallurgical grade silicon wafer is continuously conducted in a reaction chamber. Chloride gas is mixed with carrier gas. The gaseous mixture is used to clean the surface of the silicon wafer. Then, the gaseous mixture is used to form a porous structure on the surface of the silicon wafer before hot annealing is executed. Finally, the gaseous mixture is used to execute hot etching on the surface of the silicon wafer and remove the porous structure from the surface of the silicon wafer. As the chloride gas is used to clean the surface of the silicon wafer and form the porous structure on the surface of the silicon wafer, external gettering is improved. Moreover, interstitial-type metal impurities are effectively removed from the interior of the silicon wafer.

6 Claims, 5 Drawing Sheets

IN-SITU GETTERING METHOD FOR REMOVING METAL IMPURITIES FROM THE SURFACE AND INTERIOR OF A UPGRADED METALLURGICAL GRADE SILICON WAFER

BACKGROUND OF INVENTION

1. Field of Invention

The present invention relates to an in-situ gettering method for removing metal impurities from the surface and interior of a upgraded metallurgical grade silicon wafer in a reaction chamber in a continuous manner.

2. Related Prior Art

The current industrial solar cell market is mainly based on crystalline silicon. A standard silicon module of solar cells is made on a high-purity silicon wafer. Since much efforts are necessary to produce high-purity silicon wafer, the cost of the standard silicon module is about 50% on the silicon wafer.

There has been proposed physical metallurgy for making upgraded metallurgical grade silicon (UMG-Si) wafers. The physical metallurgy is relatively environmentally friendly, simple and inexpensive. However, the silicon wafer produced by physical metallurgy involves a relatively high concentration of impurities and a relatively short minority carrier lifetime. Hence, a UMG-Si based solar cell is vulnerable to low efficiency and photo-degradation. Therefore, the physical metallurgy silicon wafer is not suitable for solar cell fabrication.

In an epitaxial wafer-equivalent method, an epitaxial silicon layer is deposited on a UMG-Si wafer. It is supposed to produce relatively efficient silicon solar cells at a relatively low cost. The resultant silicon solar cells are however vulnerable to diffusion of metal impurities therein and the efficiency thereof is inevitably affected. Hence, it is an important issue to remove metal impurities from the interior of a UMG-Si wafer.

The present invention is therefore intended to obviate or at least alleviate the problems encountered in prior art.

SUMMARY OF INVENTION

It is the primary objective of the present invention to provide a simple, inexpensive method for removing metal impurities from the surface and interior of a upgraded metallurgical grade silicon wafer in a reaction chamber in a continuous manner.

To achieve the foregoing objective, the method includes the steps of cleaning the surface of the upgraded metallurgical grade silicon wafer, forming a porous structure of silicon, hot annealing the surface of the upgraded metallurgical grade silicon wafer in carrier gas, and removing the porous structure of silicon from the surface of the upgraded metallurgical grade silicon wafer. At the step of cleaning the surface of the upgraded metallurgical grade silicon wafer, the surface of the upgraded metallurgical grade silicon wafer is provided with first mixture of chloride gas with carrier gas. Thus, the chloride gas reacts with the metal impurities on the surface of the upgraded metallurgical grade silicon wafer and forms metal chloride. The metal chloride is evaporated from the surface of the upgraded metallurgical grade silicon wafer at high temperature. The carrier gas is used to remove the metal chloride from the surface of the upgraded metallurgical grade silicon wafer. At the step of forming a porous structure of silicon, the surface of the upgraded metallurgical grade silicon wafer is etched with second mixture of chloride gas with carrier gas. At the step of removing the porous structure of silicon from the surface of the upgraded metallurgical grade silicon wafer, the surface of the upgraded metallurgical grade silicon wafer is etched with third mixture of chloride gas with carrier gas.

In an aspect, the chloride gas is hydrochloric acid gas.

In another aspect, the carrier gas is hydrogen.

In another aspect, the reaction chamber is an atmospheric pressure chemical vapor deposition system.

In another aspect, the purity of the upgraded metallurgical grade silicon wafer is 4N to 6N (99.99%-99.9999%), and the thickness of the upgraded metallurgical grade silicon wafer is about 200 micrometers.

In another aspect, the step of cleaning the surface of the surface of the upgraded metallurgical grade silicon wafer is executed at 1150° C., and the concentration of the chloride gas in the first mixture is lower than 5%.

In another aspect, the step of forming the porous structure of silicon is executed at about 1000° C., and the concentration of the chloride gas in the second mixture is about 10%.

In another aspect, the step of hot annealing is executed at temperature higher than 1000° C.

In another aspect, the step of removing the porous structure of silicon is executed at temperature higher than 1150° C., and the concentration of the chloride gas in the third mixture is higher than 5%.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
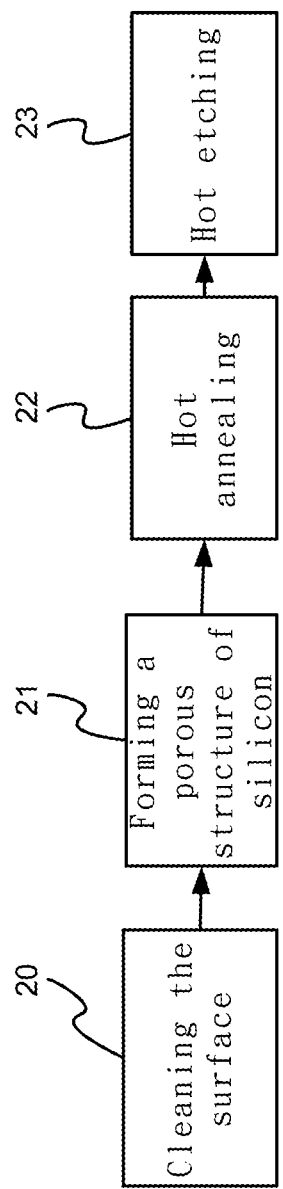
FIG. 1 is a flow chart of an in-situ gettering method for removing metal Impurities from the surface and interior of a upgraded metallurgical grade silicon ("UMG-Si") wafer according to the preferred embodiment of the present invention.
Figure 2:
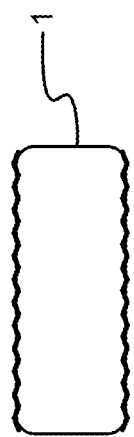
FIG. 2 is a cross-sectional view of the UMG-Si wafer at a first step in the method shown in FIG. 1.

Referring to FIGS. 1 and 2, there is shown an in-situ gettering method for removing metal Impurities from the surface and interior of a upgraded metallurgical grade silicon ("UMG-Si") wafer 1 according to the preferred embodiment of the present invention. The method is executed in a reaction chamber (not shown) in a continuous manner. The reaction chamber may be an atmospheric pressure chemical vapor deposition ("AP-CVD") system. The purity of the UMG-Si wafer 1 is 4N to 6N (99.99% to 99.9999%) and the thickness of the UMG-Si wafer is about 200 micrometers.

Figure 3:
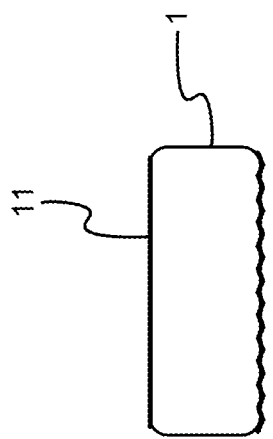
FIG. 3 is a cross-sectional view of the UMG-Si wafer at a second step in the method shown in FIG. 1.

Referring to FIGS. 1 and 3, at 20, the surface of the UMG-Si wafer is cleaned. Chloride gas is mixed with carrier gas to provide first mixture. The first mixture is provided on the UMG-Si wafer 1 so that the chloride gas therein reacts with metal impurities on the surface 11 of the UMG-Si wafer 1 and form metal chlorides. At high temperature, the metal chlorides are evaporated and removed from the surface 11 of the UMG-Si wafer 1. The chloride gas may be hydrochloric acid ("HCl") gas, and the carrier gas may be hydrogen. The temperature is higher than 1150° C. The concentration of the chloride gas in the first mixture is lower than 5%.

Figure 4:
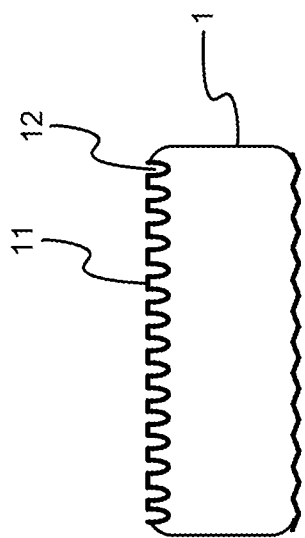
FIG. 4 is a cross-sectional view of the UMG-Si wafer at a third step in the method shown in FIG. 1.

Referring to FIGS. 1 and 4, at 21, there is formed a porous structure 12 of silicon. Chloride gas is mixed with carrier gas to provide second mixture. The second mixture is used to etch the surface 11 of the UMG-Si wafer 1 and form the porous structure 12. In the second mixture, the chloride gas may be HCl gas, and the carrier gas may be hydrogen. In the formation of the porous structure 12, the temperature is about 1000° C., and the concentration of the chloride gas in the second mixture is about 10%.

At 22, the UMG-Si wafer 1 is annealed. The UMG-Si wafer 1 is subjected to heat treating at high temperature in carrier gas. The carrier gas may be hydrogen, and the temperature is higher than 1000° C.

Figure 5:
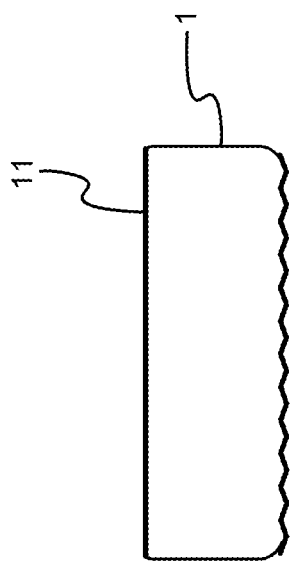
FIG. 5 is a cross-sectional view of the UMG-Si wafer at a fourth step in the method shown in FIG. 1.

Referring to FIGS. 1 and 5, at 23, the UMG-Si wafer 1 is subjected to heat treating. Chloride gas is mixed with carrier gas to provide third mixture. The third mixture is used to etch and remove the porous structure 12 of silicon from the surface 11 of the UMG-Si wafer 1 at high temperature. In the third mixture, the chloride gas may be HCl gas, and the carrier gas may be hydrogen. In the heat treating, the temperature is higher than 1150° C., and the concentration of the chloride gas in the third mixture is higher than 5%.

In an alternative embodiment, the method may include only the formation (21) of the porous structure, the hot annealing (22) and the hot etching (23).

The method of the present invention exhibits at least two advantageous features. At first, the external gettering is excellent. The chloride gas reacts with the UMG-Si wafer 1 to remove the metal impurities from the surface 11 of the UMG-Si wafer 1. Moreover, the chloride gas provides the surface 11 of the UMG-Si wafer 1 with the porous structure 12 that traps the impurities. Thus, the concentration of interstitial-type metal impurities in the UMG-Si wafer 1 is reduced.

Secondly, in a single reaction chamber and a continuous process, the removing of the metal impurities and the epitaxial growth of a thin film of silicon are conducted. Therefore, the equipment and process are simple and efficient. In view of the above advantages, the silicon wafer can be used as a substrate in a silicon thin-film epitaxy and used for a low cost silicon solar cell.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. An in-situ gettering method for removing metal impurities from the surface and interior of a upgraded metallurgical grade silicon wafer in a reaction chamber in a continuous manner including the steps of:
   cleaning the surface of the upgraded metallurgical grade silicon wafer including the steps of:
      providing the surface of the upgraded metallurgical grade silicon wafer with a first mixture of less than 5% hydrochloric acid gas with hydrogen carrier gas so that the hydrochloric acid gas mixture reacts with the metal impurities on the surface of the upgraded metallurgical grade silicon wafer and forms metal chloride;
      evaporating the metal chloride from the surface of the upgraded metallurgical grade silicon wafer at 1150° C.; and
      using the hydrogen carrier gas to remove the metal chloride from the surface of the upgraded metallurgical grade silicon wafer;
   forming a porous structure of silicon by etching the surface of the upgraded metallurgical grade silicon wafer with a second mixture of about 10% hydrochloric acid gas with hydrogen carrier gas at about 1000° C.;
   hot annealing the surface of the upgraded metallurgical grade silicon wafer in hydrogen carrier gas at temperature higher than 1000° C.; and
   removing the porous structure of silicon from the surface of the upgraded metallurgical grade silicon wafer by hot etching the surface of the upgraded metallurgical grade silicon wafer with a third mixture of more than 5% hydrochloric acid gas with hydrogen carrier gas at temperature higher than 1150° C.

2. The method according to claim 1, wherein the reaction chamber is an atmospheric pressure chemical vapor deposition system.

3. The method according to claim 1, wherein the purity of the upgraded metallurgical grade silicon wafer is 4N to 6N (99.99%-99.9999%), wherein the thickness of the upgraded metallurgical grade silicon wafer is about 200 micrometers.

4. An in-situ gettering method for removing metal impurities from the surface and interior of a upgraded metallurgical grade silicon wafer in a reaction chamber in a continuous manner including the steps of:
   forming a porous structure of silicon by etching the surface of the upgraded metallurgical grade silicon wafer with a mixture of about 10% hydrochloric acid gas with hydrogen carrier gas at about 1000° C.;
   hot annealing the surface of the upgraded metallurgical grade silicon wafer in hydrogen carrier gas at temperature higher than 1000° C.; and
   removing the porous structure of silicon from the surface of the upgraded metallurgical grade silicon wafer by hot etching the surface of the upgraded metallurgical grade silicon wafer with a mixture of more than 5% hydrochloric acid gas with hydrogen carrier gas at temperature higher than 1150° C.

5. The method according to claim 4, wherein the reaction chamber is an atmospheric pressure chemical vapor deposition system.

6. The method according to claim 4, wherein the purity of the upgraded metallurgical grade silicon wafer is 4N to 6N (99.99%-99.9999%), wherein the thickness of the upgraded metallurgical grade silicon wafer is about 200 micrometers.

* * * * *